(12) United States Patent
Takahashi et al.

(10) Patent No.: US 8,182,115 B2
(45) Date of Patent: May 22, 2012

(54) LIGHT SOURCE DEVICE

(75) Inventors: Hidenori Takahashi, Saitama (JP); Noriyoshi Kumazawa, Saitama (JP)

(73) Assignee: Fujinon Corporation, Saitama-shi (JP)

( * ) Notice: Subject to any disclaimer, the term of this patent is extended or adjusted under 35 U.S.C. 154(b) by 336 days.

(21) Appl. No.: 12/541,684

(22) Filed: Aug. 14, 2009

(65) Prior Publication Data
US 2010/0085758 A1 Apr. 8, 2010

(30) Foreign Application Priority Data
Oct. 2, 2008 (JP) ................ P2008-257058

(51) Int. Cl.
*F21V 9/00* (2006.01)
(52) U.S. Cl. .................. 362/293; 362/311.02
(58) Field of Classification Search .................. 362/260, 362/293, 311.02
See application file for complete search history.

(56) References Cited

U.S. PATENT DOCUMENTS

| 4,047,805 | A | 9/1977 | Sekimura |
| 5,962,971 | A | 10/1999 | Chen |
| 6,417,019 | B1 | 7/2002 | Mueller et al. |
| 2005/0127833 | A1 * | 6/2005 | Tieszen ................ 313/512 |

FOREIGN PATENT DOCUMENTS

| DE | 10 2007 056 562 | 5/2009 |
| EP | 1 313 152 | 5/2003 |
| JP | 2000-133005 A | 5/2000 |
| JP | 2004-93322 A | 3/2004 |
| WO | WO-2008/103876 | 8/2008 |
| WO | WO-2009/065451 | 5/2009 |

OTHER PUBLICATIONS

European Search Report issued Jan. 27, 2010 in corresponding European Patent Application No. 09010468.8.

* cited by examiner

*Primary Examiner* — David V Bruce

(74) *Attorney, Agent, or Firm* — Birch, Stewart, Kolasch & Birch, LLP

(57) ABSTRACT

Disclosed is a light source device that has lower costs and lower power consumption compared to a halogen lamp, and has the same spectral characteristics as the halogen lamp. The light source device includes a white LED that emits White light having an emission peak in a blue range and an optical filter that partially reduces the quantity of light in the blue range in the white light emitted from the white LED such that the spectral characteristics of the white light emitted from the white LED are close to those of light emitted from a halogen lamp.

2 Claims, 6 Drawing Sheets

SPECTRAL TRANSMISSION CHARACTERISTICS OF OPTICAL FILTER

FIG.3

| EXAMPLE OF DESIGN OF OPTICAL FILM ||||
|---|---|---|---|
| LAYER | FILM MATERIAL | REFRACTIVE INDEX (WAVELENGTH 633nm) | FILM THICKNESS d (nm) |
| 1 | TiO$_2$ | 2.31 | 23 |
| 2 | SiO$_2$ | 1.47 | 40 |
| 3 | TiO$_2$ | 2.31 | 74 |
| 4 | SiO$_2$ | 1.47 | 13 |
| 5 | TiO$_2$ | 2.31 | 81 |
| 6 | SiO$_2$ | 1.47 | 20 |
| 7 | TiO$_2$ | 2.31 | 81 |
| 8 | SiO$_2$ | 1.47 | 19 |
| 9 | TiO$_2$ | 2.31 | 78 |
| 10 | SiO$_2$ | 1.47 | 21 |
| 11 | TiO$_2$ | 2.31 | 79 |
| 12 | SiO$_2$ | 1.47 | 22 |
| 13 | TiO$_2$ | 2.31 | 77 |
| 14 | SiO$_2$ | 1.47 | 20 |
| 15 | TiO$_2$ | 2.31 | 77 |
| 16 | SiO$_2$ | 1.47 | 17 |
| 17 | TiO$_2$ | 2.31 | 178 |
| 18 | SiO$_2$ | 1.47 | 110 |

SPECTRAL TRANSMISSION CHARACTERISTICS OF OPTICAL FILTER

SPECTRAL CHARACTERISTICS OF HALOGEN LAMP

SPECTRAL CHARACTERISTICS OF WHITE LED

SPECTRAL CHARACTERISTICS OF HALOGEN LAMP AND WHITE LED

LIGHT SOURCE DEVICE

CROSS-REFERENCE TO RELATED APPLICATIONS

This application is based upon and claims the benefit of priority from the Japanese Patent Application No. 2008-257058 filed on Oct. 2, 2008; the entire contents of which are incorporated herein by reference.

BACKGROUND OF THE INVENTION

1. Field of the Invention

The present invention relates to a light source device using a white LED (light emitting diode).

2. Description of the Related Art

A halogen lamp has been used as, for example, a light source in a device that uses light to perform various measurements. For example, the halogen lamp has been used as the light source in a device that evaluates the performance of a lens, such as an MTF (modulation transfer function) measuring device. JP-A-2004-93322 discloses a structure in which a halogen lamp is used as the light source to analyze and measure the function of a sample. In addition, JP-A-2000-133005 discloses a structure in which a halogen lamp is used as the light source of a solar simulator.

In recent years, a white LED has been developed. Since the white LED has lower costs and lower power consumption compared to the halogen lamp, it is considered that the white LED can be used as a light source instead of the halogen lamp. A first type of white LED is obtained by combining a red LED, a green LED, and a blue LED. This type of white LED mixes color light components emitted from the LEDs and emits white light. A second type of white LED includes a blue LED chip that emits blue light and a fluorescent material that is excited by the blue light emitted from the blue LED chip and emits yellow light, and mixes the blue light emitted from the blue LED chip and the yellow light emitted from the fluorescent material to emit white light. However, the spectral characteristics (spectral distribution) of the white LED are different from those of the halogen lamp. Therefore, particularly, it is difficult to merely replace the light sources of various types of measuring devices with the white LEDs. For example, when the white LED is used as the light source in a device for evaluating the performance of a lens, the difference in spectral characteristics between the light sources causes the chromatic aberration of the lens.

FIG. 6 is a diagram illustrating the spectral characteristics of a typical halogen lamp. FIG. 7 is a diagram illustrating the spectral characteristics of a typical white LED. In addition, FIG. 7 shows the spectral characteristics of the second type of white LED. FIG. 8 is a diagram illustrating the spectral characteristics of the halogen lamp and the spectral characteristics of the white LED at the same time for comparison therebetween. In FIG. 8, a solid line indicates the spectral characteristics of the halogen lamp and a broken line indicates the spectral characteristics of the white LED. In FIGS. 6 to 8, the horizontal axis indicates a wavelength (nm) and the vertical axis indicates the quantity of light. In addition, the vertical axis indicates the quantity of light in an arbitrary unit.

As shown in FIG. 6, the halogen lamp has a spectral distribution in which an emission peak is in the intermediate wavelength range (yellow range) of visible light and the quantity of light is gradually reduced toward the short wavelength range (blue range) and the long wavelength range (red range) of the visible light. In contrast, the second type of white LED mixes the blue light emitted from the blue LED chip and light emitted from a yellowish fluorescent material by the blue light, which is excitation light. Therefore, as shown in FIG. 7, the second type of white LED has emission peaks in both the blue range and the yellow region. As shown in FIG. 8, the emission peak in the blue range is the main difference in spectral distribution between the halogen lamp and the white LED. Therefore, for example, when the halogen lamp, which is the light source in a device for evaluating the performance of a lens, is merely replaced with the white LED, a pronounced aberration of blue light is observed compared to when the halogen lamp is used as the light source.

SUMMARY OF THE INVENTION

The invention has been made in order to solve the above-mentioned problems, and an object of the invention is to provide a light source device that has lower costs and lower power consumption compared to a halogen lamp, and has the same spectral characteristics as the halogen lamp.

According to an aspect of the invention, a light source device includes: a white LED that emits white light having an emission peak in a blue range; and an optical filter that partially reduces the quantity of light in the blue range in the white light emitted from the white LED.

In the light source device according to the above-mentioned aspect of the invention, the white LED emits white light having an emission peak in the blue range. The optical filter partially reduces the quantity of light in the blue range in the white light. In this way, the spectral characteristics of the white light emitted from the white LED are close to those of light emitted from the halogen lamp.

In the light source device according to the above-mentioned aspect, the optical filter may have spectral transmission characteristics in which transmittance is equal to or greater than 5% and equal to or less than 20% in the wavelength range of equal to or greater than 435 nm and equal to or less than 465 nm and is equal to or greater than 80% in the wavelength range of equal to or less than 405 nm and equal to or greater than 490 nm, in the wavelength range of the light source used.

In the light source device according to the above-mentioned aspect, the white LED may include: a blue LED chip that emits blue light; and a fluorescent material that is excited by the blue light emitted from the blue LED chip and emits yellow light. The white LED may mix the blue light emitted from the blue LED chip and the yellow light emitted from the fluorescent material and emit the white light.

The light source device according to the above-mentioned aspect of the invention uses a white LED as the light source. Therefore, it is possible to reduce costs and power consumption compared to when a halogen lamp is used. In addition, the optical filter partially reduces the quantity of light in the blue range such that the spectral characteristics of white light emitted from the white LED are close to those of light emitted from the halogen lamp. Therefore, it is possible to obtain the same spectral characteristics as those of the halogen lamp.

BRIEF DESCRIPTION OF THE DRAWINGS

FIG. 3 is a diagram illustrating an example of the design of an optical thin film for achieving the spectral transmission characteristics shown in FIG. 2;

DESCRIPTION OF THE PREFERRED EMBODIMENTS

Hereinafter, exemplary embodiments of the invention will be described in detail with reference to the accompanying drawings.

Figure 1:
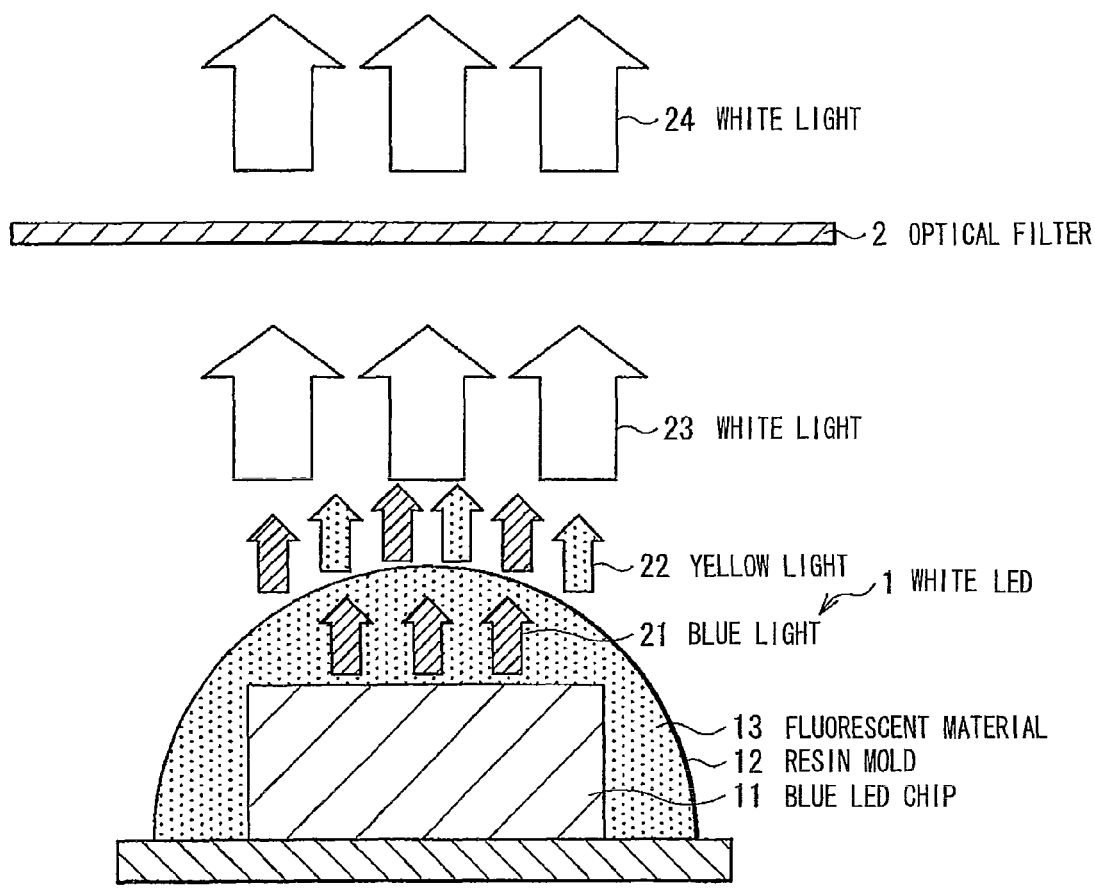
FIG. 1 is a diagram illustrating an example of the structure of a light source device according to an embodiment of the invention.
Figure 7:
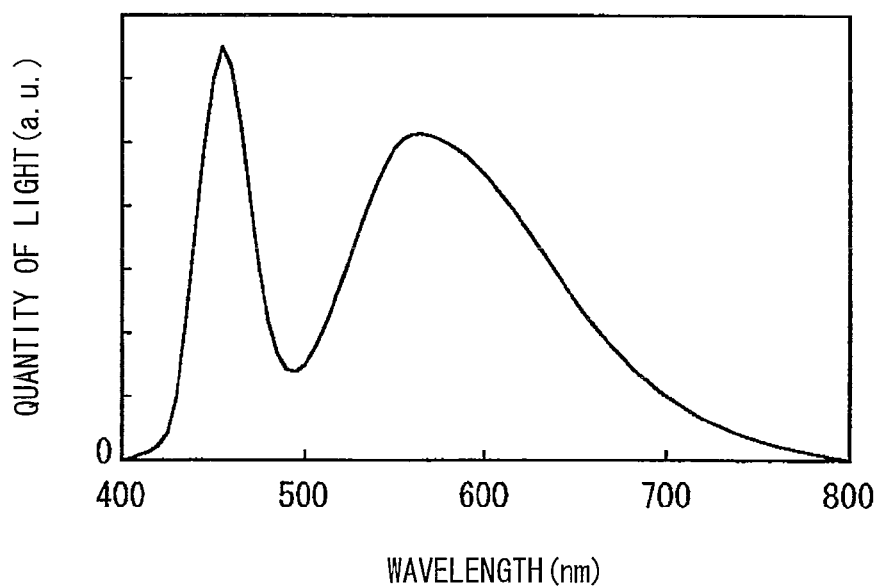
FIG. 7 is a diagram illustrating the spectral characteristics of a typical white LED.

FIG. 1 is a diagram illustrating an example of the structure of a light source device according to an embodiment of the invention. The light source device includes a white LED 1 and an optical filter 2. The white LED 1 emits white light 23 having an emission peak in the blue range shown in FIG. 7.

The white LED 1 includes a blue LED chip 11 that emits blue light 21 and a fluorescent material 13 that is excited by the blue light 21 emitted from the blue LED chip 11 and emits yellow light 22. The white LED 1 mixes the blue light 21 emitted from the blue LED chip 11 and the yellow light 22 emitted from the fluorescent material 13 and emits the white light 23. The blue LED chip 11 is a light-emitting element made of, for example, a GaN-based (gallium nitride-based) semiconductor material. The blue LED chip 11 is molded by a transparent resin mold 12. A fluorescent pigment or a fluorescent dye using the blue light 21 as excitation light is dispersed as a fluorescent material 13 in the resin mold 12.

The optical filter 2 partially reduces the quantity of light in the blue range in the white light 23 emitted from the white LED 1 and outputs white light 24 having the reduced amount of light in the blue range. For example, the optical filter 2 is obtained by forming an optical thin film on a plate-shaped transparent substrate.

Figure 2:
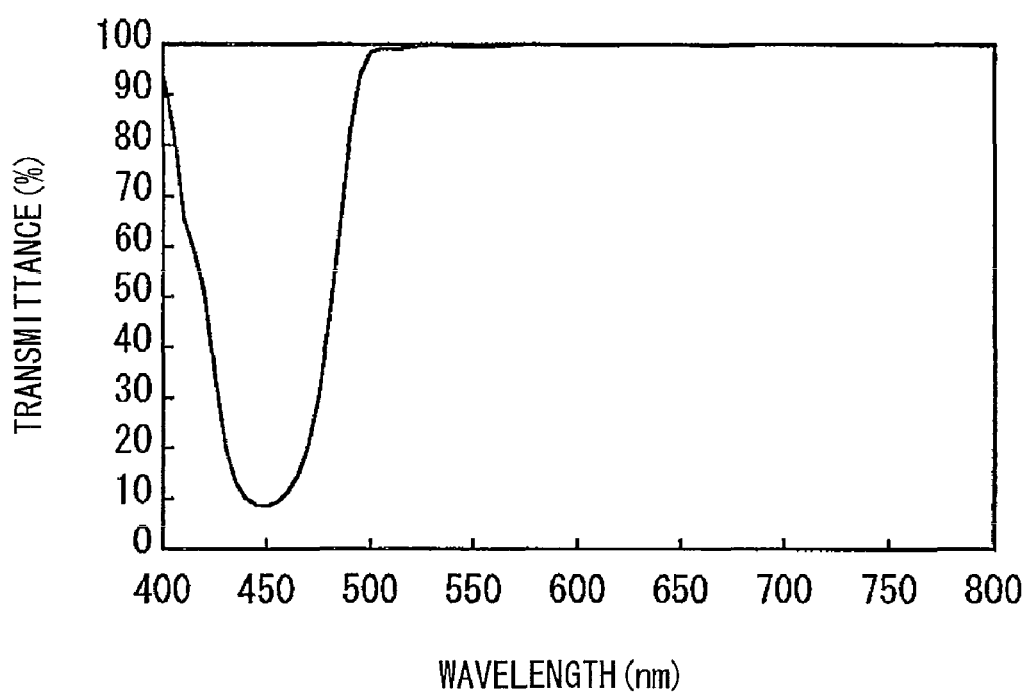
FIG. 2 is a diagram illustrating an example of the spectral transmission characteristics of an optical filter used in the light source device according to the embodiment of the invention.

FIG. 2 is a diagram illustrating an example of the spectral transmission characteristics of the optical filter 2. FIG. 3 is a diagram illustrating an example of the design of an optical thin film for achieving the spectral transmission characteristics shown in FIG. 2. In the design example, the substrate of the optical filter 2 has a refractive index of 1.52. However, for example, a film material, the number of layers, and the thickness of each layer are not limited to the design example.

In the light source device, the white LED 1 emits the white light 23 having an emission peak in the blue range. The optical filter 2 partially reduces the quantity of light in the blue range in the white light 23. In this way, it is possible to obtain the white light 24 having spectral characteristics close to those of light emitted from a halogen lamp.

Figure 6:
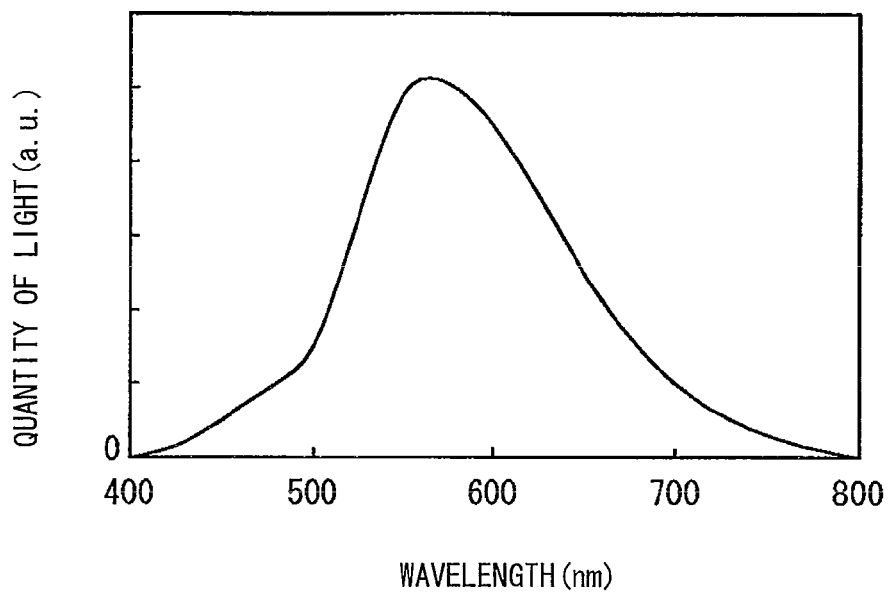
FIG. 6 is a diagram illustrating the spectral characteristics of a typical halogen lamp.
Figure 8:
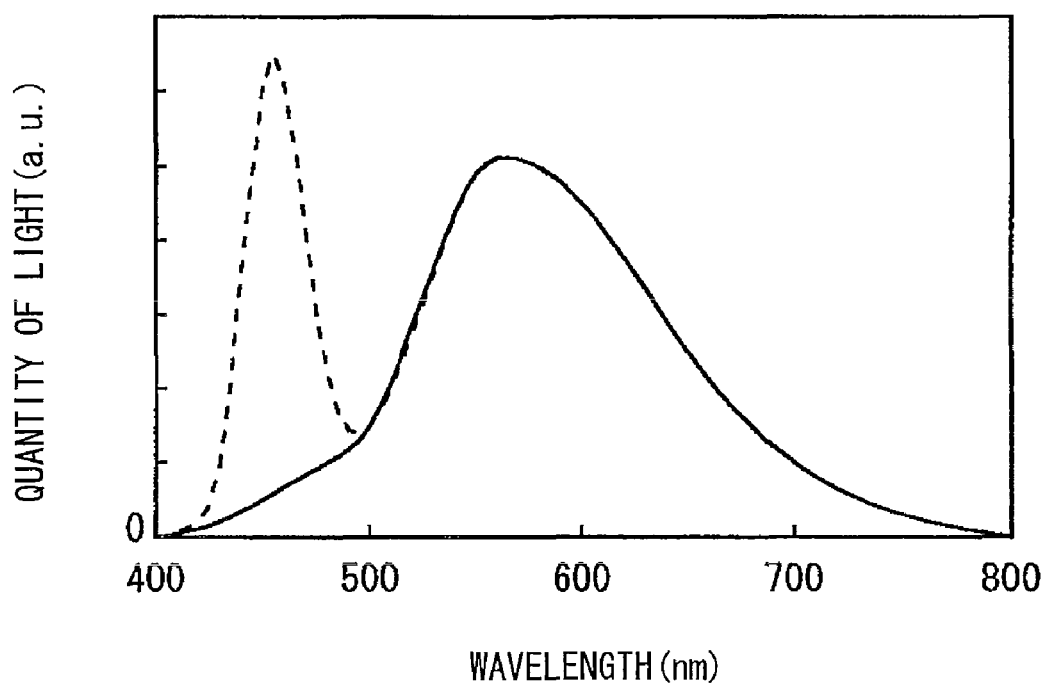
FIG. 8 is a diagram illustrating the spectral characteristics of the halogen lamp and the spectral characteristics of the white LED at the same time.

Next, the conditions of the characteristics that the optical filter 2 needs to satisfy will be described with reference to FIG. 4. The light source device according to this embodiment has the characteristics that it uses the white LED 1 to finally emit the white light 24 having spectral characteristics close to those of light emitted from the halogen lamp. As described above with reference to FIGS. 6 to 8, the main difference in spectral distribution between the halogen lamp and the white LED 1 is the emission peak portion of light in the blue range emitted from the white LED 1. Therefore, the optical filter 2 needs to have characteristics that reduce the quantity of light having an emission peak in the blue range, which is different from the halogen lamp. In this case, as shown in FIG. 8, there is little difference in spectral distribution between the white LED 1 and the halogen lamp in the ranges other than the blue range. Therefore, it is preferable that the optical filter 2 transmit light emitted from the white LED 1 without any change in the ranges other than the blue range. In addition, it is preferable that the optical filter 2 does not reduce the transmission of light in the blue range completely to zero, but transmit a certain amount of light in the blue range.

Figure 4:
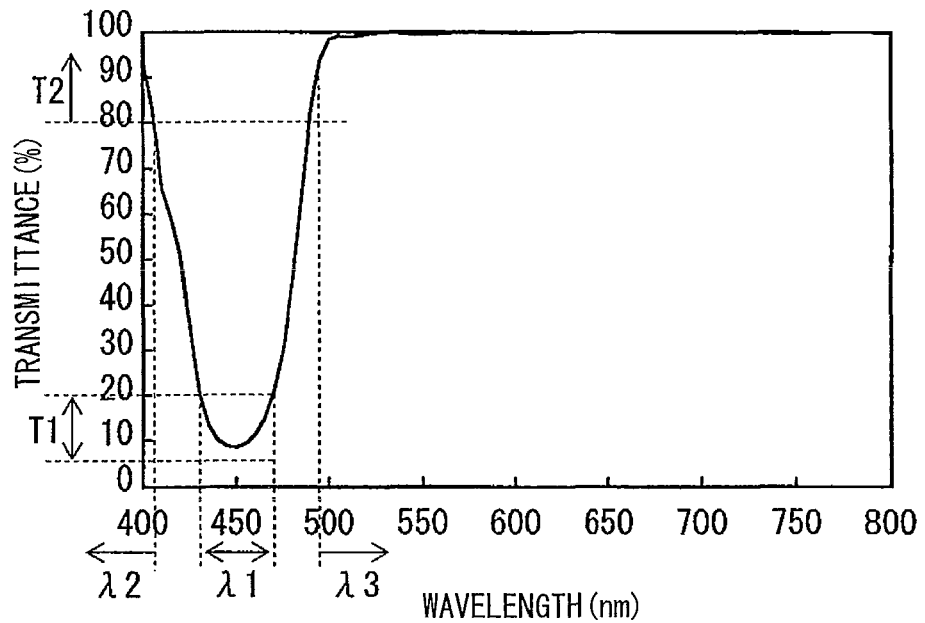
FIG. 4 is a diagram illustrating the conditions which the spectral transmission characteristics of the optical filter used in the light source device according to the embodiment of the invention need to satisfy.

Specifically, as shown in FIG. 4, the optical filter 2 preferably has spectral transmission characteristics in which transmittance is within a predetermined range T1 (for example, in the range of equal to or greater than 5% and equal to or less than 20%) in a specific wavelength range $\lambda 1$ (for example, in the range of equal to or greater than 435 nm and equal to or less than 465 nm) of the blue range, in the wavelength range of the light source used. In addition, the optical filter 2 preferably has spectral transmission characteristics in which transmittance is equal to or greater than a predetermined value T2 (for example, equal to or greater than 80%) in a wavelength range $\lambda 2$ (for example, in the range of equal to or less than 405 nm) which is narrower than the specific wavelength range $\lambda 1$ and a wavelength range $\lambda 3$ (for example, in the range of equal to or greater than 490 nm) which is wider than the specific wavelength range $\lambda 1$, in the wavelength range of the light source used.

Figure 5:
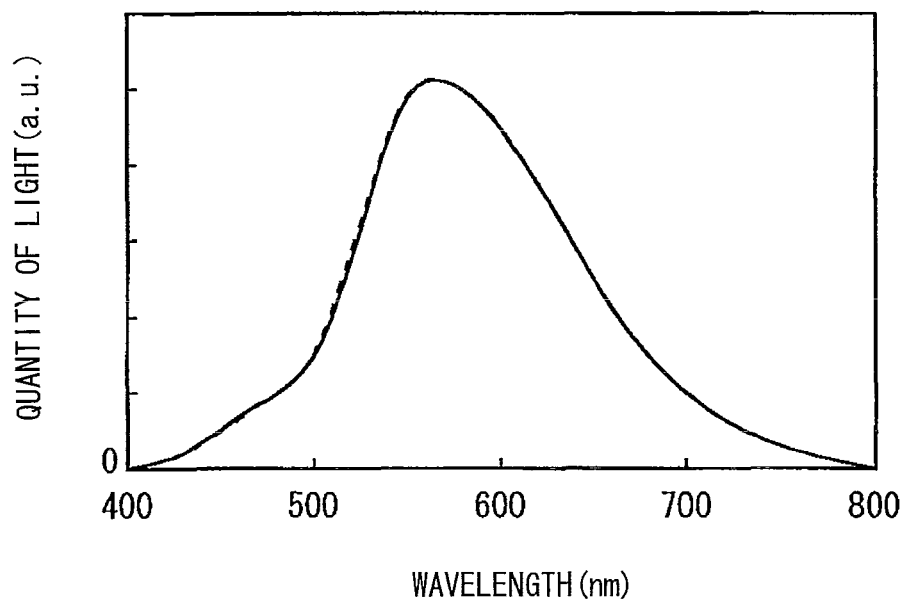
FIG. 5 is a diagram illustrating the spectral characteristics of the light source device according to the embodiment of the invention.

FIG. 5 is a diagram illustrating the spectral characteristics (represented by a solid line) of the halogen lamp and the spectral characteristics (represented by a broken line) of light (white light 24) finally emitted from the light source device according to this embodiment. The characteristics represented by the broken line in FIG. 5 are obtained when the white LED 1 has the characteristics shown in FIG. 7 and the optical filter 2 has the characteristics shown in FIG. 2. In FIG. 5, the vertical axis indicates the quantity of light in an arbitrary unit. FIG. 5 shows the relative quantity of light between two light sources, that is, between the halogen lamp and the light source device according to this embodiment when the maximum value of the quantity of light emitted from each of the two light sources is normalized to 1. As shown in FIG. 5, light finally emitted from the light source device according to this embodiment has substantially the same characteristics as that emitted from the halogen lamp.

As described above, according to the light source device of this embodiment, the white LED 1 is used as the light source. Therefore, it is possible to reduce costs and power consumption compared to when the halogen lamp is used. According to the light source device of this embodiment, it is possible to significantly reduce power consumption compared to when the halogen lamp is used. Therefore, it is possible to reduce running costs. In addition, the optical filter 2 partially reduces the quantity of light in the blue range such that the spectral characteristics of the white light 23 emitted from the white LED 1 are close to those of light emitted from the halogen lamp. Therefore, light (white light 24) finally emitted from the light source device can have the same spectral characteristics as that emitted from the halogen lamp. In this way, it is possible to use the light source device according to this embodiment as the light source for, for example, a measuring device that has used the halogen lamp as the light source, without having concerns about variations in optical performance.

What is claimed is:

1. A light source device comprising:
   a white LED that emits white light having an emission peak in a blue range; and
   an optical filter that partially reduces the quantity of light in the blue range in the white light emitted from the white LED,
   wherein the optical filter has spectral transmission characteristics in which transmittance is equal to or greater than 5% and equal to or less than 20% in the wavelength range of equal to or greater than 435 nm and equal to or less than 465 nm and is equal to or greater than 80% in the wavelength range of equal to or less than 405 nm and equal to or greater than 490 nm, in the wavelength range of a light source used.

2. The light source device according to claim 1,
   wherein the white LED includes:
   a blue LED chip that emits blue light; and
   a fluorescent material that is excited by the blue light emitted from the blue LED chip and emits yellow light, and
   the white LED mixes the blue light emitted from the blue LED chip and the yellow light emitted from the fluorescent material and emits the white light.

* * * * *